(12) United States Patent
Song (10) Patent No.: US 9,275,716 B2
(45) Date of Patent: Mar. 1, 2016

(54) CELL ARRAY AND MEMORY WITH STORED VALUE UPDATE

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 297 days.

(21) Appl. No.: 13/719,906

(22) Filed: Dec. 19, 2012

(65) Prior Publication Data

US 2014/0078845 A1 Mar. 20, 2014

(30) Foreign Application Priority Data

Sep. 20, 2012 (KR) .................. 10-2012-0104745

(51) Int. Cl.
| | |
|---|---|
| G11C 7/00 | (2006.01) |
| G11C 11/402 | (2006.01) |
| G11C 7/20 | (2006.01) |
| G11C 11/406 | (2006.01) |
| G11C 7/02 | (2006.01) |
| G11C 11/408 | (2006.01) |

(52) U.S. Cl.
CPC ............. *G11C 11/402* (2013.01); *G11C 7/02* (2013.01); *G11C 7/20* (2013.01); *G11C 11/406* (2013.01); *G11C 11/4085* (2013.01); *G11C 2211/4065* (2013.01)

(58) Field of Classification Search
None
See application file for complete search history.

(56) References Cited

U.S. PATENT DOCUMENTS

2007/0014174 A1* 1/2007 Ohsawa .................. 365/222
2009/0213675 A1* 8/2009 Shino .................... 365/205

FOREIGN PATENT DOCUMENTS

| KR | 1020080064476 | 7/2008 |
|---|---|---|
| KR | 1020130136342 | 12/2013 |

OTHER PUBLICATIONS

Song, Choung-Ki; U.S. Appl. No. 14/084,243.*
Song, Choung-Ki; U.S. Appl. No. 14/085,478.*

* cited by examiner

*Primary Examiner* — Kretelia Graham
(74) *Attorney, Agent, or Firm* — IP & T Group LLP

(57) ABSTRACT

A memory includes a first cell array configured to include a plurality of first memory cells connected to a plurality of word lines, a second cell array configured to include a plurality of second memory cells connected to the plurality of word lines, wherein a group of the plurality of second memory cells which are connected to a corresponding word line stores the number of activations for the corresponding word line, and an activation number update unit configured to update a value stored in the corresponding group of the plurality of second memory cells connected to the activated word line of the plurality of word lines.

8 Claims, 5 Drawing Sheets

CELL ARRAY AND MEMORY WITH STORED VALUE UPDATE

CROSS-REFERENCE TO RELATED APPLICATIONS

The present application claims priority of Korean Patent Application No. 10-2012-0104745, filed on Sep. 20, 2012, which is incorporated herein by reference in its entirety.

BACKGROUND

1. Field

Exemplary embodiments of the present invention relate to semiconductor design technology, and more particularly, to a cell array, a memory, and a memory system including the same, which is capable of counting and storing the number of activation times that each word line is repeatedly activated, and detecting whether the number of times for a specific word line is equal to or greater than the number of reference times.

2. Description of the Related Art

As an increase in the degree of integration of a memory, intervals among word lines included in the memory, such as DRAM, are reduced. As the intervals among the word lines are reduced, a coupling effect between adjacent word lines is increased.

Meanwhile, whenever data is input/output to or from a memory cell, a selected word line is toggled between an activated state and a deactivated state. As described above, as the coupling effect between adjacent word lines is increased, data of a memory cell connected to word lines adjacent to the excessive activated word line may be degraded. Such a phenomenon is called word line disturbance or word line hammer. Due to the word line disturbance, before a memory cell is refreshed, data of the memory cell may be damaged.

Figure 1:
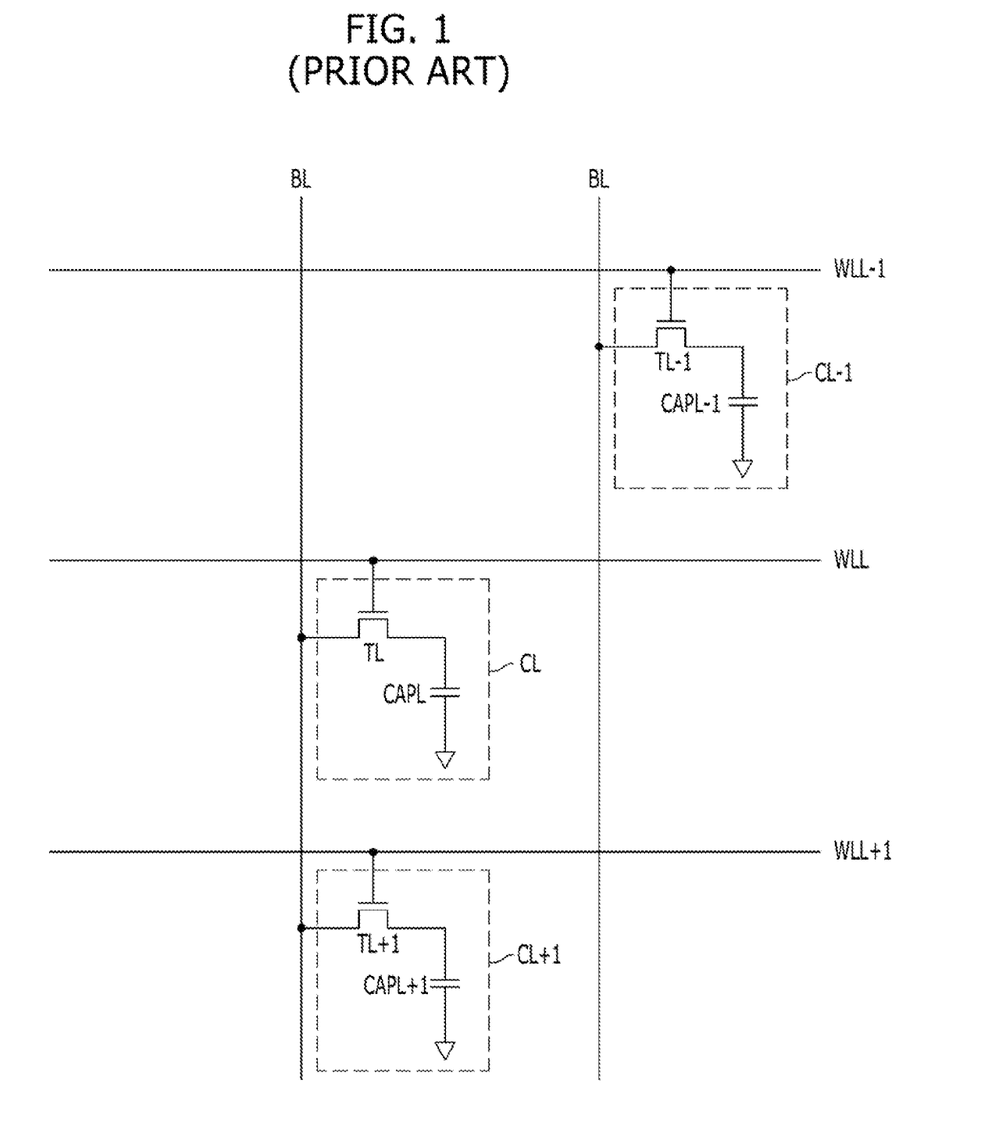
FIG. 1 is a diagram illustrating a part of a cell array in DRAM for explaining the word line disturbance.

FIG. 1 is a diagram illustrating a part of a cell array in DRAM for explaining the word line disturbance.

In FIG. 1, 'WLL' corresponds to a word line excessive activated, and 'WLL−1' and 'WLL+1' correspond to word lines adjacent to the 'WLL', that is, word lines 'WLL−1' and 'WLL+1' are disposed adjacent to the excessive activated word line 'WLL'. Furthermore, 'CL' indicates a memory cell connected to the 'WLL', 'CL−1' indicates a memory cell connected to the 'WLL−1', and 'CL+1' indicates a memory cell connected to the 'WLL+1'. The memory cells include cell transistors TL, TL−1, and TL+1 and cell capacitors CAPL, CAPL−1, and CAPL+1, respectively.

When the word line 'WLL' is activated or deactivated, voltages of the word lines 'WLL−1' and the 'WLL+1' are increased or decreased due to a coupling phenomenon among the word lines 'WLL' and 'WLL−1' and among the word lines 'WLL' and 'WLL+1'. Accordingly, the amount of charges charged in the cell capacitors CAPL−1 and CAPL+1 is affected, so that data of the memory cells CL−1 and CL+1 is degraded.

Furthermore, electromagnetic waves, which are generated when the word line is toggled between the activated state and the deactivated state, allow electrons to be introduced into cell capacitors of the memory cells connected to adjacent word lines or to be discharged from the cell capacitor, so that data may be damaged.

To substantially prevent degradation of data due to the word line disturbance, it may be necessary to provide a scheme for detecting the excessive activated word lines, and thus a method for counting the number of activations for each word line may be desirable.

SUMMARY

Exemplary embodiments of the present invention are directed to a cell array, a memory, and a memory system, being capable of storing counting information on the number of activation for each word lines while minimizing an area increase occupied in circuit for counting.

Other embodiments of the present invention are directed to a cell array, a memory, and a memory system, being capable of efficiently preventing degradation of data due to word line disturbance.

In accordance with an embodiment of the present invention, a memory includes a first cell array configured to include a plurality of first memory cells connected to a plurality of word lines; a second cell array configured to include a plurality of second memory cells, which are connected to the plurality of word lines, wherein a group of the plurality of second memory cells, which are connected to a word line, stores the number of activations for the word line; and an activation number update unit configured to update a value stored in the group of the plurality of second memory cells connected to the activated word line of the plurality of word lines. In accordance with another embodiment of the present invention, a memory includes a first cell array configured to include a plurality of first memory cells connected to a plurality of word lines; a second cell array configured to include a plurality of second memory cells, which are connected to the plurality of word lines, wherein a group of the plurality of second memory cells, which are connected to a word line stores the number of activations for the word line; a transfer signal generation unit configured to activate a first transfer signal in response to an active command or a refresh command, and to activate a second transfer signal after the first transfer signal is activated and a predetermined time lapses; and a stored value update unit configured to receive and increase a value stored in the group of the plurality of second memory cells connected to a activated word line among the plurality of word lines, in response to the first transfer signal, and to transfer and update the increased value to the group of the plurality of second memory cells in response to the second transfer signal.

In accordance with another embodiment of the present invention, a memory system includes a memory configured to include a first cell array including a plurality of first memory cells connected to a plurality of word lines, and a second cell array including a plurality of second memory cells, which are connected to the plurality of word lines, wherein a group of the plurality of second memory cells, which are connected to a corresponding word line, stores the number of activations for the word line, and configured to generate an alert signal when the number of activations for the word line is equal to or greater than a given reference value; and a memory controller configured to apply an excessive address and one or more adjacent addresses having a value adjacent to the excessive address to the memory in a special refresh mode, wherein the excessive address corresponds to a word line of which the number of activation is equal to or more than a given reference value.

In accordance with another embodiment of the present invention, a cell array includes a first area configured to include a first cell array including a plurality of first memory cells connected to a plurality of word lines; and a second area configured to include a plurality of second memory cells, which are connected to the plurality of word lines, wherein a group of the plurality of second memory cells, which are connected to a word line stores the number of activations for the word line. According to the embodiments of the present invention, it may be possible to store the number of activations of each word line in specific memory cells connected to the corresponding word line, and to update the value stored in the specific memory cells when the each word line is activated, thereby counting the number of activations of each word line while minimizing an area increase occupied in circuit for counting.

Furthermore, according to the embodiments of the present invention, when the number of activations of a specific word line is more than the number of given times, the specific word line may be efficiently detected and may output the information, so that it may be possible to substantially prevent degradation of data due to word line disturbance.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereinafter, a word line adjacent to a specific word line may indicate a word line arranged near the specific word line within a predetermined distance. Here, the number of word lines arranged between the specific word line and the adjacent word line may be equal to or less than a predetermined number. That is, the range of the word line adjacent to the specific word line may be changed according to design. Hereinafter, a description will be provided for the case in which the adjacent word line is a word line arranged directly next to the specific word line (i.e., the number of word lines arranged between the specific word line and the adjacent word line is 0).

Figure 2:
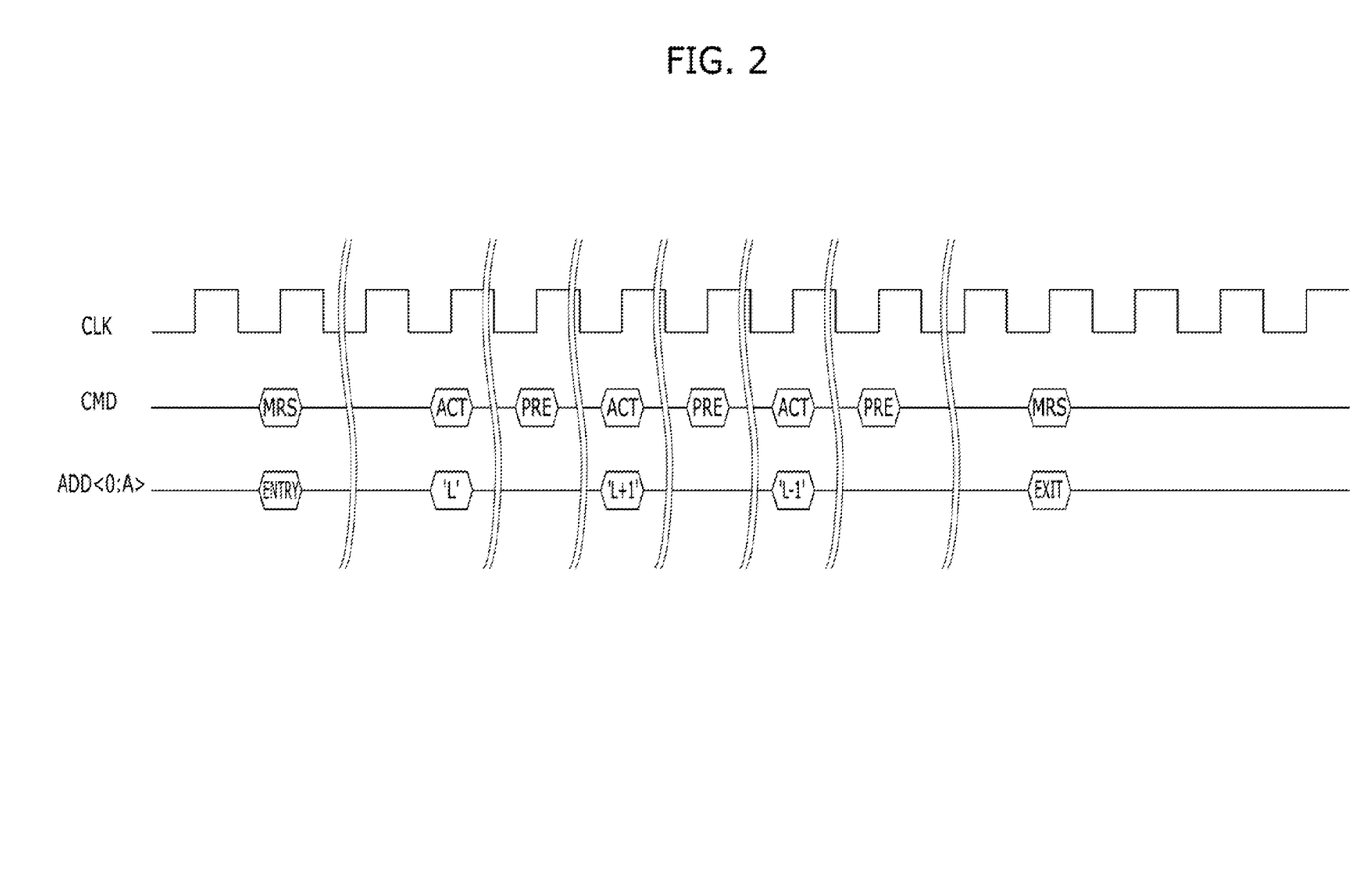
FIG. 2 is a timing diagram for explaining a special refresh operation in a memory system.

FIG. 2 is a timing diagram for explaining a special refresh operation in a memory system.

A memory (not illustrated in FIG. 2) includes first to $N^{th}$ word lines (N is a natural number), and a memory controller (not illustrated in FIG. 2) applies various signals such as a clock signal CLK, command signals CMDs, addresses ADD<0:A>, and data (not illustrated in FIG. 2) to the memory to control the memory. Hereinafter, a value of an address corresponding to an $L^{th}$ word line (L is a natural number satisfying 1≤L≤N) of the first to $N^{th}$ word lines will be indicated by 'L'.

The number of activations for the first to $N^{th}$ word lines is substantially equal to the number of times by which an address corresponding to the first to $N^{th}$ word lines is input from the memory controller to the memory together with an active command. For example, when the memory controller inputs an address '15' ten times together with the active command, it represents that a $15^{th}$ word line is activated ten times. Thus, the memory or the memory controller determines whether a excessive activated word line is detected by counting the number of application of the address corresponding to the first to $N^{th}$ word lines, where the excessive activated word line indicates a specific word line activated more times than the number of given times. The number of given times may be a value determined internally in a memory system, or a value input from an exterior of the memory system.

When a first specific address combination is input from the memory controller together with a MRS command (MRS), the memory enters a special refresh mode by mode resistor setting ('entry' setting). When a second specific address combination is input together with the MRS command (MRS), the memory exits from the special refresh mode ('exit' setting). Compensating for data degradation by entering the special refresh mode by using the MRS command and the specific address combination is for illustrative purposes only. For example, it may be possible to control the memory to perform the aforementioned compensation operation using a newly defined signal or a combination of existing signals according to design.

In the special refresh mode, the memory controller operates the memory in units of 'compensation cycles' including an operation for inputting an address (hereinafter, referred to as an excessive address) together with the active command, and an operation for activating one or more word lines adjacent to a word line corresponding to the excessive address, where the excessive address corresponds to an address input equal to or more times than the number of given times. Hereinafter, a description will be provided for a case in which an address 'L' corresponding to the $L^{th}$ word line is the excessive address.

In each compensation cycle, a first active command ACT and the excessive address L are input to the memory. After a given time lapses, a precharge command PRE is input to the memory. The memory activates the $L^{th}$ word line in response to the active command ACT and the address 'L', and deactivates the activated $L^{th}$ word line in response to the precharge command PRE.

Then, the active command ACT and addresses L+1 and L−1 corresponding to word lines adjacent to the $L^{th}$ word line are sequentially input. In FIG. 2, a second active command ACT and the address L+1 are input, and a third active command ACT and the address L−1 are input. Accordingly, an $L+1^{th}$ word line and an $L-1^{th}$ word line of the memory are sequentially activated. Furthermore, an input order of the address L+1 and the address L−1 may be changed.

When an operation for activating the word lines adjacent to the $L^{th}$ word line is completed, the memory exits from the special refresh mode by the second specific address combination input from the memory controller together with the MRS command.

When a word line is activated, data of memory cells connected to the word line is refreshed. Consequently, in the special refresh mode, word lines adjacent to a word line corresponding to the excessive address are activated, so that it may be possible to substantially prevent data degradation from occurring due to the word line disturbance.

To perform the aforementioned special refresh operation, it may be desirable to detect the excessive address.

Figure 3:
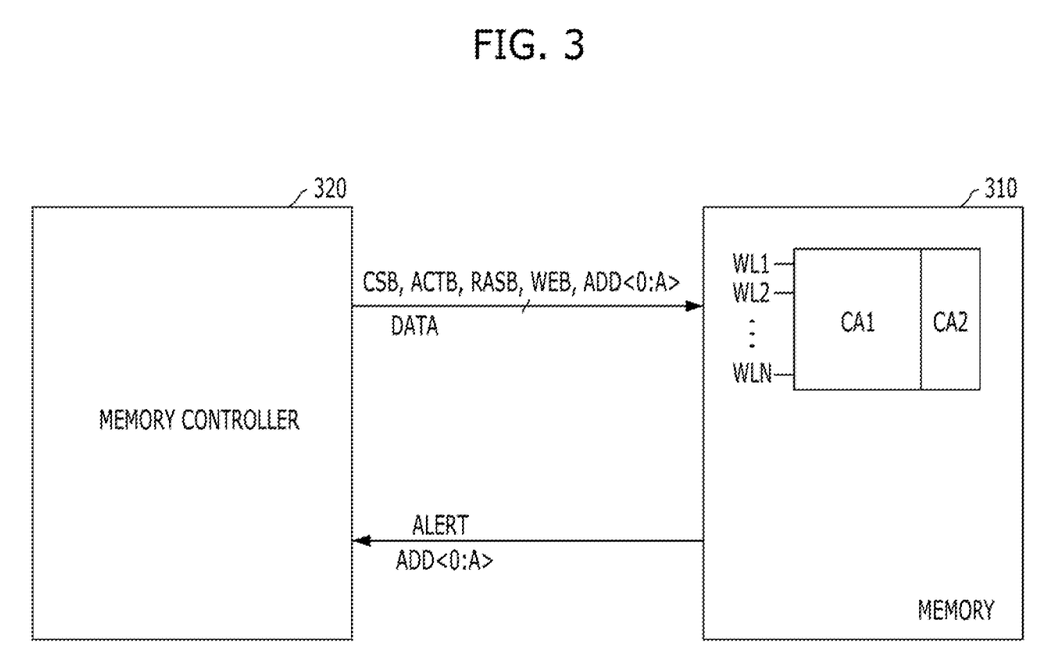
FIG. 3 is a configuration diagram illustrating a memory system in accordance with an embodiment of the present invention.

FIG. 3 is a configuration diagram illustrating a memory system in accordance with an embodiment of the present invention.

As illustrated in FIG. 3, the memory system includes a memory 310 and a memory controller 320. The memory 310 includes a first cell array CA1 configured to include a plurality of first memory cells (not illustrated in FIG. 3) connected to first to $N^{th}$ word lines WL1 to WLN, and a second cell array CA2 configured to include a plurality of second memory cells (not illustrated in FIG. 3) which are connected to the first to $N^{th}$ word lines WL1 to WLN. A group of the plurality of second memory cells connected to a corresponding word line among the first to $N^{th}$ word lines WL1 to WLN stores the number of activations for the corresponding word line. When the number of activation of the corresponding word lines among the first to $N^{th}$ word lines WL1 to WLN is equal to or greater than a given reference value, the memory 310 generates an alert signal ALERT. The memory controller 320 is configured to apply an excessive address, which corresponds to a word line (hereinafter, referred to as 'the excessive activated word line') of which the number of activation is equal to or more than the given reference value, and one or more adjacent addresses having a value adjacent to the excessive address to the memory 310 in the special refresh mode. For example, when the excessive address is '5', the adjacent value addresses is '4' or '6'.

The memory controller 320 is configured to input command signals to the memory 310, wherein the command signals include a chip select signal CSB, an active signal ACTB, a row address strobe signal RASB, a column address strobe signal CASB, and a write enable signal WEB. Applying a specific command from the memory controller 320 to the memory 310 represents that a combination of the command signals CSB, ACTB, RASB, CASB, and WEB corresponds to the specific command. For example, applying an active command from the memory controller 320 to the memory 310 represents that the combination of the command signals CSB, ACTB, RASB, CASB, and WEB applied from the memory controller 320 to the memory 310 corresponds to the active command. A command decoder (not illustrated in FIG. 3) included in the memory 310 is configured to decode the command signals CSB, ACTB, RASB, CASB, and WEB and to generate internal commands of the memory 310. Furthermore, the memory controller 320 applies addresses ADD<0:A>, data g and the like to the memory 310 for the operation for the memory 310, in addition to the command signals CSB, ACTB, RASB, CASB, and WEB.

Hereinafter, the special refresh mode indicates an operation mode of activating a word line adjacent to the excessive activated word line, and refreshing data of a plurality of memory cells connected to the word lines adjacent to the excessive activated word line.

With reference to FIG. 3, the memory system will be described.

The first cell array CA1 includes the plurality of first memory cells (not illustrated in FIG. 3) connected to the first to $N^{th}$ word lines WL1 to WLN. The first memory cells are used to store general data input to/output from the memory 310. Furthermore, the second cell array CA2 includes the plurality of second memory cells (not illustrated in FIG. 3) connected to the first to $N^{th}$ word lines WL1 to WLN. The second memory cells store the number of activation of the corresponding word line among the first to $N^{th}$ word lines WL1 to WLN. For example, the plurality of second memory cells connected to a $K^{th}$ word line WLK store the number of activations of the $K^{th}$ word line WLK.

Hereinafter, a description will be provided for a method in which the memory 310 stores the number of activations of the first to $N^{th}$ word lines WL1 to WLN in the second cell array CA2, and updates a value stored in the second cell array CA2.

The memory 310 decodes the command signals CSB, ACTB, RASB, CASB, and WEB applied from the memory controller 320, and generates an active command for activating a word line, a precharge command for precharging a word line, a refresh command for performing a refresh operation for a memory cell, a read command for reading data of a memory cell, a write command for writing data in a memory cell, a MRS command (mode resister set command) for setting a mode resister set, and the like.

The memory 310 updates a value stored in a plurality of second memory cells connected to an activated word line. (1) In the case of activating word lines corresponding to the addresses ADD<0:A> in response to the active command, the memory 310 increases a value stored in a plurality of second memory cells connected to the word lines corresponding to the addresses ADD<0:A>. (2) In the case of activating word lines while performing a refresh operation or a special refresh operation, the memory 310 initializes a value stored in a plurality of second memory cells connected to the activated word lines. The initialization indicates that the number of activations of the word line stored in the plurality of second memory cells is made '0'.

(1) A Case of Increasing the Value Stored in the Plurality of Second Memory Cells In order to perform the special refresh operation described in FIG. 2, since it is necessary to detect an excessive address, the number of activation for each word line activated in response to the active command is counted. Accordingly, when word lines corresponding to the addresses ADD<0:A> are activated in response to the active command, the memory 310 increases a value stored in a plurality of second memory cells connected to the activated word line.

In more detail, since a plurality of first memory cells and a plurality of second memory cells connected to the activated word line are electrically connected to bit lines BL corresponding to the plurality of first memory cells and the plurality of second memory cells, data is transferred between the memory cells connected to the activated word line and the bit lines. The memory 310 increases, by '1', a value output from the plurality of second memory cells connected to the word line activated in response to the active command, and stores the increased value in the plurality of second memory cells connected to the word line activated in response to the active command. Accordingly, whenever a word line is activated in response to the active command, a value stored in the plurality of second memory cells connected to the activated word line is increased by '1'.

Furthermore, when the value stored in the plurality of second memory cells connected to the activated word line is equal to or more than the given reference value, the memory 310 activates the alert signal ALERT that alerts the necessity of the special refresh operation. When the alert signal ALERT is activated, it is possible for the memory 310 to store the addresses ADD<0:A> applied to the memory 310.

When the alert signal ALERT is activated, it is possible for the memory controller 320 to control the memory 310 in order to perform the special refresh operation described in FIG. 2. The memory controller 320 may allow the memory 310 to enter the special refresh mode immediately when the alert signal ALERT is activated, or may allow the memory 310 to enter the special refresh mode after the alert signal ALERT is activated and a predetermined time lapses. The memory 310 operates in the special refresh mode from the time point at which the memory 310 enters the special refresh mode to the time point at which the memory 310 exits from the special refresh mode.

(2) A Case of Initializing the Value Stored in the Plurality of Second Memory Cells While the memory 310 are performing the refresh operation, when the plurality of first memory cells included in the memory 310 and connected to the first to $N^{th}$ word lines WL1 to WLN are refreshed, it is necessary to count the number of activations of each word line from the beginning and to detect a word line activated beyond the number of reference times. Furthermore, when a specific word line is activated beyond the number of reference times and the special refresh operation is performed for a word line adjacent to the specific word line, it is necessary to count the number of activations of the specific word line from the beginning and to detect a word line activated beyond the number of reference times. Accordingly, when a plurality of first memory cells connected to word lines activated through the refresh operation or the special refresh operation are refreshed, the memory 310 initializes a value stored in a plurality of second memory cells connected to some of the activated word lines. The reason for initializing the value stored in the plurality of second memory cells connected to the word lines activated in the refresh operation is because a plurality of word lines are sequentially activated in the refresh operation, word lines adjacent to the activated word lines are directly activated, and thus data of a plurality of first memory cells connected to the adjacent word lines are refreshed.

In more detail, the memory 310 initializes, to '0', a value output from a plurality of second memory cells connected to the word lines activated in the refresh operation, and stores the initialized value in the plurality of second memory cells connected to the activated word lines. Furthermore, the memory 310 initializes, to '0', a value output from a plurality of second memory cells connected to the primarily activated word line (a word line corresponding to the excessive address) in the aforementioned 'compensation cycle' in the special refresh operation, and stores the initialized value in the plurality of second memory cells connected to the activated word line.

With reference to FIG. 3, the operation for the memory system in the special refresh mode will be described.

When the alert signal ALERT is activated, the memory controller 320 allows the memory 310 to enter the special refresh mode by a combination of the command signals CSB, ACTB, RASB, and WEB and the addresses ADD<0:A>. After the memory 310 enters the special refresh mode, the memory controller 320 sequentially applies the excessive address L, and the addresses L+1 and L−1 corresponding to word lines adjacent to a word line corresponding to the excessive address L, together with the active command ACT. The memory 310 activates a $L^{th}$ word line WLL, a $L+1^{th}$ word line WLL+1, and a $L-1^{th}$ word line WLL−1 corresponding to the addresses 'L', 'L+1', and 'L−1' in response to the active command ACT. When the special refresh operation is completed, the memory controller 320 allows the memory 310 to exit from the special refresh mode by the combination of the command signals CSB, ACTB, RASB, and WEB and the addresses ADD<0:A>.

The memory system according to the present invention stores the number of activations for a corresponding word line, using a memory cell connected to each word line, thereby minimizing an area required to include a configuration for counting the number of activations of each word line. When counters corresponding to each word line are provided in order to count the number of activations of each word line, a large area is required regardless of the configuration of the counter, as compared with the present invention. Furthermore, the memory system detects a word line activated beyond the number of reference times and enables the special refresh operation described in FIG. 2, thereby solving the problems occurring due to the word line disturbance.

Figure 4:
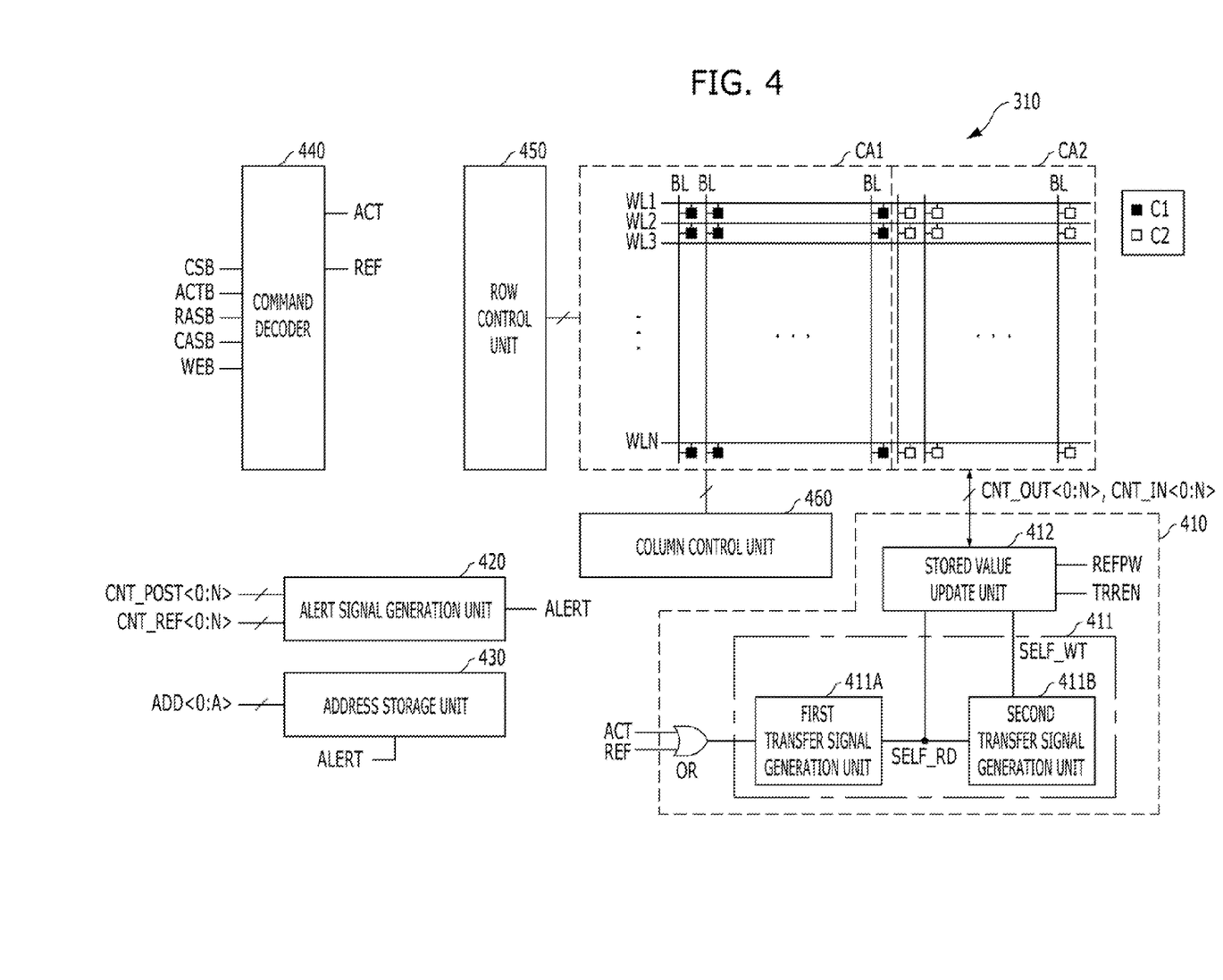
FIG. 4 is a configuration diagram illustrating a memory in accordance with another embodiment of the present invention.

FIG. 4 is a configuration diagram illustrating the memory 310 in accordance with another embodiment of the present invention.

As illustrated in FIG. 4, the memory 310 includes a first cell array CA1, a second cell array CA2, an activation number update unit 410, an alert signal generation unit 420, and an address storage unit 430. The first cell array CA1 is configured to include a plurality of first memory cells C1 connected to first to $N^{th}$ word lines WL1 to WLN. The second cell array CA2 is configured to include a plurality of second memory cells C2 which are connected to the first to $N^{th}$ word lines WL1 to WLN and store the number of activation of word lines, to which the plurality of second memory cells C2 are connected, is activated among the first to $N^{th}$ word lines WL1 to WLN. The activation number update unit 410 is configured to update a value stored in a plurality of second memory cells C2 connected to activated word lines of the first to $N^{th}$ word lines WL1 to WLN. The alert signal generation unit 420 is configured to activate the alert signal ALERT when the number of activations of a word line corresponding to addresses ADD<0:A> stored in a plurality of second memory cells C2 connected to the word line corresponding to the addresses ADD<0:A> is equal to or more than the given reference value. The address storage unit 430 is configured to store the addresses ADD<0:A> when the alert signal ALERT is activated.

Furthermore, the memory 310 includes a command decoder 440, a row control unit 450, and a column control unit 460. The command decoder 440 is configured to decode the command signals CSB, ACTB, RASB, CASB, and WEB input from the memory controller 320, and to generate an active command ACT, a precharge command (not illustrated in FIG. 4), a refresh command REF, a read command (not illustrated in FIG. 4), and a write command (not illustrated in FIG. 4), a MRS command (not illustrated in FIG. 4), and the like. The row control unit 450 is configured to control bit lines BL connected to each memory cell, and a row operation for the cell arrays CA1 and CA2. The column control unit 460 is configured to control a column operation for the first cell array CA1.

With reference to FIG. 4, the memory 310 will be described.

Data input to/output from the memory 310 is stored in the first cell array CA1, and the number of activations of the first to $N^{th}$ word lines WL1 to WLN is stored in the second cell array CA2. The row control unit 450 performs an operation for activating one or more of the first to $N^{th}$ word lines WL1 to WLN when the active command ACT, the refresh command REF and the like are applied. The column control unit 460 performs an operation required in order to read data from a plurality of first memory cells connected to the activated word lines, or to write data in the plurality of first memory cells connected to the activated word lines. Since the operation for reading data from the first cell array CA1 or writing data in the first cell array CA1 is well-known in the art and is not directly related to the present invention, a description thereof will be omitted.

The activation number update unit 410 updates a value stored in the plurality of second memory cells connected to the activated word lines. (1) When word lines corresponding to the addresses ADD<0:A> are activated in response to the active command, the activation number update unit 410 updates a value stored in a plurality of second memory cells connected to the word lines corresponding to the addresses ADD<0:A>. (2) When word lines are activated while the refresh operation for the special refresh operation is being performed, the activation number update unit 410 initializes a value stored in a plurality of second memory cells connected to the activated word lines. The initialization indicates that the number of activations of the word line stored in the plurality of second memory cells is made '0'.

(1) A Case of Increasing the Value Stored in the Plurality of Second Memory Cells The activation number update unit 410 reads the value stored in the plurality of second memory cells connected to the word lines activated in response to the active command ACT after the active command ACT is applied and a predetermined time (a first time) lapses. Next, the activation number update unit 410 increases the read value by '1' and writes a value finally increased in the plurality of second memory cells connected to the activated word lines.

(2) A Case of Initializing the Value Stored in the Plurality of Second Memory Cells The activation number update unit 410 reads the value stored in the plurality of second memory cells connected to the word lines activated in response to the refresh command REF when the memory 310 performs the refresh operation. Next, the activation number update unit 410 initializes the read value to an initial value (for example, '0'), and writes the initial value in the plurality of second memory cells C2 connected to the activated word lines. Furthermore, the activation number update unit 410 reads the value stored in the plurality of second memory cells connected to the word lines activated in response to the active command ACT when the memory 310 performs the special refresh operation. Next, the activation number update unit 410 initializes the read value to an initial value (for example, '0'), and writes the initial value in the plurality of second memory cells C2 connected to the activated word lines.

For the aforementioned operation, the activation number update unit 410 includes a transfer signal generation unit 411 and a stored value update unit 412.

The transfer signal generation unit 411 is configured to activate a first transfer signal SELF_RD in response to the active command ACT or the refresh command REF, and to activate a second transfer signal SELF_WT after the first transfer signal SELF_RD is activated and a predetermined time lapses.

In more detail, the transfer signal generation unit 411 activates the first transfer signal SELF_RD after a first time lapses from the time point at which the active command ACT or the refresh command REF is applied from the command decoder 440. The first time may be tRCD (Ras to Cas Delay, a time for which after a RAS signal is activated, charge of the bit line BL is sufficiently distributed and a bit line sense amplifier amplifies data of the bit line). Next, the transfer signal generation unit 411 activates the second transfer signal SELF_WT after a second time lapses from the time point at which the first transfer signal SELF_RD is activated. The second time may be a time required until the value output from the plurality of second memory cells C2 connected to the activated word lines is completely updated by the stored value update unit 412.

For such an operation, the transfer signal generation unit 411 includes a first transfer signal generation unit 411A and a second transfer signal generation unit 411B. The first transfer signal generation unit 411A is configured to delay the active command ACT or the refresh command REF by the first time and generate the first transfer signal SELF_RD. The second transfer signal generation unit 411B is configured to delay the first transfer signal SELF_RD by the second time and generate the second transfer signal SELF_WT. The first transfer signal generation unit 411A and the second transfer signal generation unit 4116 may delay their input in synchronization with a clock signal or may delay their input without being synchronized with the clock signal.

The stored value update unit 412 is configured to receive the value output from the plurality of second memory cells C2 connected to the activated word lines, in response to the first transfer signal SELF_RD, to update the received value, and to transfer the updated value to the plurality of second memory cells C2 connected to the activated word lines in response to the second transfer signal SELF_WT. Furthermore, CNT_OUT<0:N> indicate values output from the plurality of second memory cells C2 connected to the activated word lines and transferred to the stored value update unit 412, and CNT_IN<0:N> indicate values transferred to the stored value update unit 412 and input to the plurality of second memory cells C2 connected to the activated word lines.

In more detail, (1) In the case in which word lines corresponding to the addresses ADD<0:A> is activated in response to the active command ACT, when the value output from the plurality of second memory cells C2 connected to the activated word lines is transferred in response to the first transfer signal SELF_RD, the stored value update unit 412 increases this value by '1'. Then, when the second transfer signal SELF_WT is activated, the stored value update unit 412 transfers the increased value to the plurality of second memory cells C2 connected to the activated word lines.

(2) The stored value update unit 412 initializes the value output from the plurality of second memory cells C2 connected to the word lines activated in the refresh operation or the special refresh operation, and transfers the initialized value to the plurality of second memory cells C2 connected to the activated word lines.

After the refresh command REF is activated in the refresh operation and a predetermined time lapses, when the first transfer signal SELF_RD is activated, the stored value update unit 412 receives the value output from the plurality of second memory cells C2 connected to the activated word lines. At this time, the stored value update unit 412 initializes a value, which is transferred in response to a refresh signal REFPW activated for 'tRFC' which is a refresh time for one cycle, as an initial value. Then, when the second transfer signal SELF_WT is activated, the stored value update unit 412 transfers the initial value to the plurality of second memory cells C2 connected to the activated word lines.

In the case in which the word lines corresponding to the addresses ADD<0:A> is activated in response to the active command ACT in the special refresh operation, when the first transfer signal SELF_RD is activated after the active command ACT is activated and a predetermined time lapses, the stored value update unit 412 receives a value output from the plurality of second memory cells C2 connected to the word lines. At this time, the stored value update unit 412 initializes a value, which is transferred in response to a special refresh signal TRREN activated in the special refresh operation, as an initial value. Then, when the second transfer signal SELF_WT is activated, the stored value update unit 412 transfers the initial value to the plurality of second memory cells C2 connected to the activated word lines.

When the value increased or updated by the stored value update unit 412 is stored in the plurality of second memory cells C2 connected to the activated word lines, an operation for counting the number of activations for the word lines is completed.

The alert signal generation unit 420 is configured to compare CNT_POST<0:N> with information CNT_REF<0:N> on the number of reference times, and to generate the alert signal ALERT. The CNT_REF<0:N> indicate values before being updated by the stored value update unit 412, and the CNT_POST<0:N> indicate values after being updated by the stored value update unit 412. Content of these values will be described later with reference to FIG. 5. When the CNT_POST<0:N> is equal to or more than the information CNT_REF<0:N> on the number of reference times (or the CNT_POST<0:N> is larger than the information CNT_REF<0:N> on the number of reference times), since the number of activations of the word lines corresponding to the addresses ADD<0:A> is equal to or greater than the given reference value, the alert signal generation unit 420 activates the alert signal ALERT in order to inform the probability that data degradation may occur due to the word line disturbance. When the CNT_POST<0:N> is smaller than the information CNT_REF<0:N> on the number of reference times, the alert signal generation unit 420 deactivates the alert signal ALERT. The information CNT_REF<0:N> on the number of reference times may be a value preset in the memory 310 or a value input from an exterior of the memory 310. This value may be variously set according to operation environments, performance of a memory, and the like.

The alert signal ALERT may be transferred to the memory controller 320, wherein the memory controller 320 may control the memory 310 to directly perform the special refresh operation when the alert signal ALERT is activated, or may control the memory 310 to directly perform the special refresh operation after the alert signal ALERT is activated and a predetermined time lapses.

The address storage unit 430 is configured to store the addresses ADD<0:A> when the alert signal ALERT is activated. That is, when the alert signal ALERT is activated, the address storage unit 430 stores addresses ADD<0:A> corresponding to a currently activated word line. The activation of the alert signal ALERT represents that the addresses ADD<0:A> corresponding to the currently activated word line correspond to the aforementioned excessive address. When the special refresh operation is performed, since the memory controller 320 requires the excessive address, the memory 310 may store the excessive address in the address storage unit 430 and transfer the excessive address to the memory controller 320 according to necessity.

The memory according to the present invention stores the number of activations for a corresponding word line, using a memory cell connected to each word line, thereby minimizing an area required to include a configuration for counting the number of activations of each word line. Furthermore, in the refresh operation or the special refresh operation, the number of activations of a word line counted is initialized, so that it may be possible to count the number of activations of the word line from the beginning.

Figure 5:
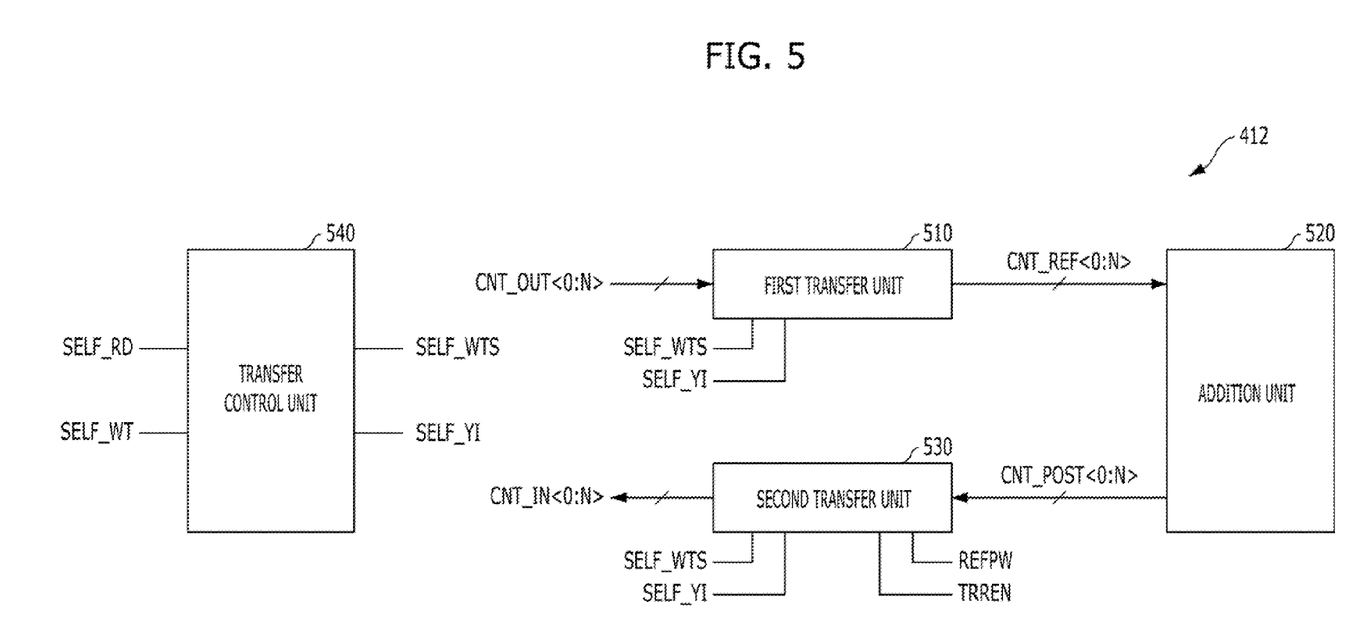
FIG. 5 is a detailed diagram of a stored value update unit shown in FIG. 4.

FIG. 5 is a detailed diagram of the stored value update unit 412 shown in FIG. 4.

As illustrated in FIG. 5, the stored value update unit 412 includes an addition unit 520, a first transfer unit 510, a second transfer unit 530, and a transfer control unit 540. The addition unit 520 is configured to increase a value input to an input terminal IN thereof by a predetermined value and output an increased value to an output terminal OUT thereof. The first transfer unit 510 is configured to transfer the values CNT_OUT<0:N>, which are output from the plurality of second memory cells C2 connected to the activated word lines of the first to $N^{th}$ word lines WL1 to WLN, to the input terminal of the addition unit 520 when the first transfer signal SELF_RD is activated. The second transfer unit 530 is configured to transfer a value, which is output to the output terminal of the addition unit 520, to the plurality of second memory cells C2 connected to the activated word lines of the first to $N^{th}$ word lines WL1 to WLN when the second transfer signal SELF_WT is activated, or to transfer an initial value to the plurality of second memory cells C2 connected to the activated word lines of the first to $N^{th}$ word lines WL1 to WLN when the memory 310 performs the refresh operation. The transfer control unit 540 is configured to controls the first transfer unit 510 and the second transfer unit 530 in response to the first transfer signal SELF_RD and the second transfer signal SELF_WT.

With reference to FIG. 5, the stored value update unit 412 will be described.

The transfer control unit 540 is configured to generate a period signal SELF_WTS and a strobe signal SELF_YI in response to the first transfer signal SELF_RD and the second transfer signal SELF_WT. The period signal SELF_WTS indicates a period in which values of a plurality of second memory cells connected to currently activated word lines are output, or a period in which an update value is stored in the plurality of second memory cells. When the period signal SELF_WTS is activated (has a high level), the period signal SELF_WTS indicates a period in which the update value is stored in the plurality of second memory cells. When the period signal SELF_WTS is deactivated (has a low level), the period signal SELF_WTS indicates a period in which the values of the plurality of second memory cells connected to the activated word lines are output. The transfer control unit 540 deactivates the period signal SELF_WTS when the first transfer signal SELF_RD is activated and activates the period signal SELF_WTS when the second transfer signal SELF_WT is activated. Furthermore, when the first transfer signal SELF_RD or the second transfer signal SELF_WT is activated, the transfer control unit 540 activates the strobe signal SELF_YI for a predetermined period.

When the first transfer signal SELF_RD is activated, the first transfer unit 510 transfers the values CNT_OUT<0:N>, which are output from the plurality of second memory cells C2 connected to the activated word lines, as the CNT_REF<0:N> which are signals of the input terminal of the addition unit 520. In more detail, the first transfer unit 510 transfers the values CNT_OUT<0:N>, which are output from the plurality of second memory cells C2 connected to the activated word lines, as the CNT_REF<0:N>, which are signals of the input terminal of the addition unit 520, in response to the period signal SELF_WTS and the strobe signal SELF_YI. In the case in which the strobe signal SELF_YI is activated when the period signal SELF_WTS is deactivated, the first transfer unit 510 transfers the values CNT_OUT<0:N>, which are output from the plurality of second memory cells C2 connected to the activated word lines, as the CNT_REF<0:N> which are signals of the input terminal of the addition unit 520.

The addition unit 520 generates the values CNT_POST<0:N> by adding a predetermined value to the values of the CNT_REF<0:N> input to the input terminal thereof, and outputs the values CNT_POST<0:N> to the output terminal thereof. The addition unit 520 may be a general adder that generates a value obtained by adding '1' to an input value.7

When the second transfer signal SELF_WT is activated, the second transfer unit 530 transfers the values CNT_POST<0:N> (that is, the added values), which are output to the output terminal of the addition unit 520, as the CNT_IN<0:N>, or initializes the CNT_IN<0:N>. In the case in which the two signals 'REFPW' and 'TRREN' described in FIG. 4 is deactivated, when the period signal SELF_WTS is activated, if the strobe signal SELF_YI is activated, the second transfer unit 530 transfers the values CNT_POST<0:N> added by the addition unit 520 as the CNT_IN<0:N>. Meanwhile, in the case in which one of the two signals 'REFPW' and 'TRREN' is activated, when the period signal SELF_WTS is activated, if the strobe signal SELF_YI is activated, the second transfer unit 530 initializes the CNT_IN<0:N>.

With reference to FIG. 4 again, the cell arrays in accordance an embodiment of the present invention will be described.

As illustrated in FIG. 4, the cell arrays CA1 and CA2 include a first area CA1 including the plurality of first memory cells C1 connected to the first to $N^{th}$ word lines WL1 to WLN, and a second area CA2 including the plurality of second memory cells C2 which are connected to the first to $N^{th}$ word lines WL1 to WLN and store the number of activation for word lines, to which the plurality of second memory cells C2 are connected, among the first to $N^{th}$ word lines WL1 to WLN.

As described in FIGS. 3 and 4, when the active command ACT is applied, the value stored in the plurality of second memory cells C2 connected to the activated word lines of the first to $N^{th}$ word lines WL1 to WLN is increased by '1'. Furthermore, when the refresh operation or the special refresh operation is performed, the value stored in the plurality of second memory cells C2 connected to the activated word lines of the first to $N^{th}$ word lines WL1 to WLN is initialized to '0'.

The cell array according to the present invention uses the plurality of second memory cells C2 which are included in the second area CA2 of the cell array in order to store the number of activations for each word line, and store the number of activations for the word lines, to which the plurality of second memory cells C2 are connected, among the first to $N^{th}$ word lines WL1 to WLN. The plurality of second memory cells C2 output the stored value whenever the word lines, to which the plurality of second memory cells C2 are connected, are activated. Consequently, since it has only to increase or initialize a value output when a word line is activated and store the value again, it may be possible to count and store the number of activations for each word line through simple configuration and operation.

While the present invention has been described with respect to the specific embodiments, it will be apparent to those skilled in the art that various changes and modifications may be made without departing from the spirit and scope of the invention as defined in the following claims.

What is claimed is:

1. A memory comprising:
   a first cell array configured to include a plurality of first memory cells connected to a plurality of word lines;
   a second cell array configured to include a plurality of second memory cells, which are connected to the plurality of word lines, wherein a group of the plurality of second memory cells, which are connected to a word line, stores a number of activations for the word line;
   a transfer signal generation unit configured to activate a first transfer signal in response to an active command or a refresh command, and to activate a second transfer signal after the first transfer signal is activated and a predetemined time lapses; and
   a stored value update unit configured to receive and increase a value stored in the group of the plurality of second memory cells connected to an activated word line among the plurality of word lines, in response to the first transfer signal, and to transfer and update the increased value to the group of the plurality of second memory cells in response to the second transfer signal.

2. The memory of claim 1, wherein the stored value update unit is configured to transfer and update an initial value to the group of the plurality of second memory cells connected to the activated word line when a refresh operation is performed.

3. The memory of claim 2, wherein the stored value update unit comprises:
   an addition unit configured to increase a value input to an input terminal by a predetermined value and output the increased value to an output terminal;
   a first transfer unit configured to transfer a value, which is output from the group of the plurality of second memory cells connected to the activated word line, to the input terminal of the addition unit when the first transfer signal is activated; and
   a second transfer unit configured to transfer a value, which is output to the output terminal of the addition unit, to the group of the plurality of second memory cells connected to the activated word line when the second transfer signal is activated, or to transfer an initial value to the group of the plurality of second memory cells connected to the activated word line when the refresh operation is performed.

4. The memory of claim 1, wherein the transfer signal generation unit is configured to activate the first transfer signal after a first time lapses when the active command or the refresh command is applied, and to activate the second transfer signal after a second time lapses when the first transfer signal is activated.

5. The memory of claim 4, wherein the transfer signal generation unit comprises:
   a first transfer signal generation unit configured to delay the active command or the refresh command by the first time to generate the first transfer signal; and
   a second transfer signal generation unit configured to delay the first transfer signal by the second time to generate the second transfer signal.

6. The memory of claim 5, wherein the first and second transfer signal generation units are configured to perform a delay operation in synchronization with a clock signal, respectively.

7. The memory of claim 1, further comprising:
   an alert signal generation unit configured to activate an alert signal when the value stored in the group of the plurality of second memory cells connected to the activated word line is equal to or greater than a given reference value.

8. The memory of claim 7, further comprising:
   an address storage unit configured to store an address corresponding to the active word line when the alert signal is activated.

* * * * *